United States Patent

Nogle et al.

[11] Patent Number: 5,973,955
[45] Date of Patent: Oct. 26, 1999

[54] COMPARISON CIRCUIT UTILIZING A DIFFERENTIAL AMPLIFIER

[75] Inventors: Scott G. Nogle; Alan S. Roth; Shuang L. Ho, all of Austin, Tex.

[73] Assignee: Motorola, Inc., Schaumburg, Ill.

[21] Appl. No.: 09/016,940

[22] Filed: Feb. 2, 1998

[51] Int. Cl.⁶ .................................................. G11C 11/00
[52] U.S. Cl. .................. 365/154; 365/189.07; 327/202; 327/208; 327/52; 327/54
[58] Field of Search ................. 365/189.07, 189.11, 365/154, 230.05; 327/199, 200, 201, 202, 208–215, 51, 52, 55, 57, 54

[56] References Cited

U.S. PATENT DOCUMENTS

| | | | |
|---|---|---|---|
| 4,607,172 | 8/1986 | Frederiksen et al. | 327/199 |
| 5,196,737 | 3/1993 | Olmstead | 327/208 |
| 5,204,560 | 4/1993 | Bredin et al. | 327/202 |
| 5,310,311 | 4/1992 | Voorman et al. | 327/199 |
| 5,625,308 | 4/1997 | Matsumoto et al. | 327/203 |

*Primary Examiner*—Tan T. Nguyen
*Attorney, Agent, or Firm*—Susan C. Hill; Joanna P. Gariazzo

[57] ABSTRACT

A pipelined dual port integrated circuit memory (20) includes an array (30) of static random access memory (SRAM) cells. A control circuit (32) controls access to the memory cells, where substantially simultaneous requests for access are serviced sequentially within a single cycle of a clock signal of a data processor that is accessing the memory (20). An address collision detector (110) uses both a differential amplifier (360) included within a D-flip-flop circuit (114) and a reference voltage provided by a reference voltage circuit (365) to compare addresses provided to the two ports, and generates a match signal that is used for determining which of the two ports are serviced first, independent of which port is read from, or written to. Because dual port functionality is obtained using a single port SRAM array (30), the memory (20) may be manufactured using relatively less integrated circuit surface area, and therefore at a lower cost.

12 Claims, 9 Drawing Sheets

COMPARISON CIRCUIT UTILIZING A DIFFERENTIAL AMPLIFIER

REFERENCE TO RELATED APPLICATIONS

The present application is related to the following U.S. patent application, "Pipelined Dual Port Integrated Circuit Memory", invented by Scott G. Nogle et al., having Ser. No. 08/902,009, filed Jul. 29, 1997, and assigned to the assignee hereof; and "Method and Apparatus For Amplifying A Signal To Produce A Latched Digital Signal", invented by Alan S. Roth et al., having Attorney Docket Number SC-90646A, filed concurrently herewith, and assigned to the assignee hereof.

FIELD OF THE INVENTION

This invention relates in general to comparison circuits, and more specifically to comparison circuits utilizing a differential amplifier.

BACKGROUND OF THE INVENTION

Dual port memories are useful for a wide variety of applications. They have special usefulness in the areas of communications and multiprocessor systems. In multiprocessor systems, one processor may write data into the array and the other processor may read data out. In particular, dual port RAMs (Random Access Memories) are especially well suited for a communications application known as Asynchronous Transfer Mode (ATM). In an ATM switch, large amounts of data must be transferred between two processing devices. Another communications application is a standard IEEE 802.3 (commonly known under the trademark "Ethernet" available from Digital Equipment Corporation) communications router. These types of applications have a need for a dual port memory which is inexpensive but includes a large array.

Conventionally, dual port random access memories (RAMs) were constructed using one of two techniques. In the first technique, each memory cell was truly dual port and thus required eight transistors. Because the large dual port memory cells make the array itself quite large, integrated circuit memories based on this technique are expensive. A second technique utilizes standard single port static RAM cells with a partitioned array. If both ports simultaneously attempt to access the same partition, then one of the accesses must be delayed. As the number of partitions increases, the likelihood that a collision will occur decreases, but the cost increases due to the extra decoding and collision detection circuitry. Thus, what is needed is a large dual port RAM which uses conventional single port SRAM cells but which is also inexpensive and fast. These needs are met by the present invention whose features and advantages will be further described with reference to the drawings and the accompanying description.

DETAILED DESCRIPTION

Figure 1:
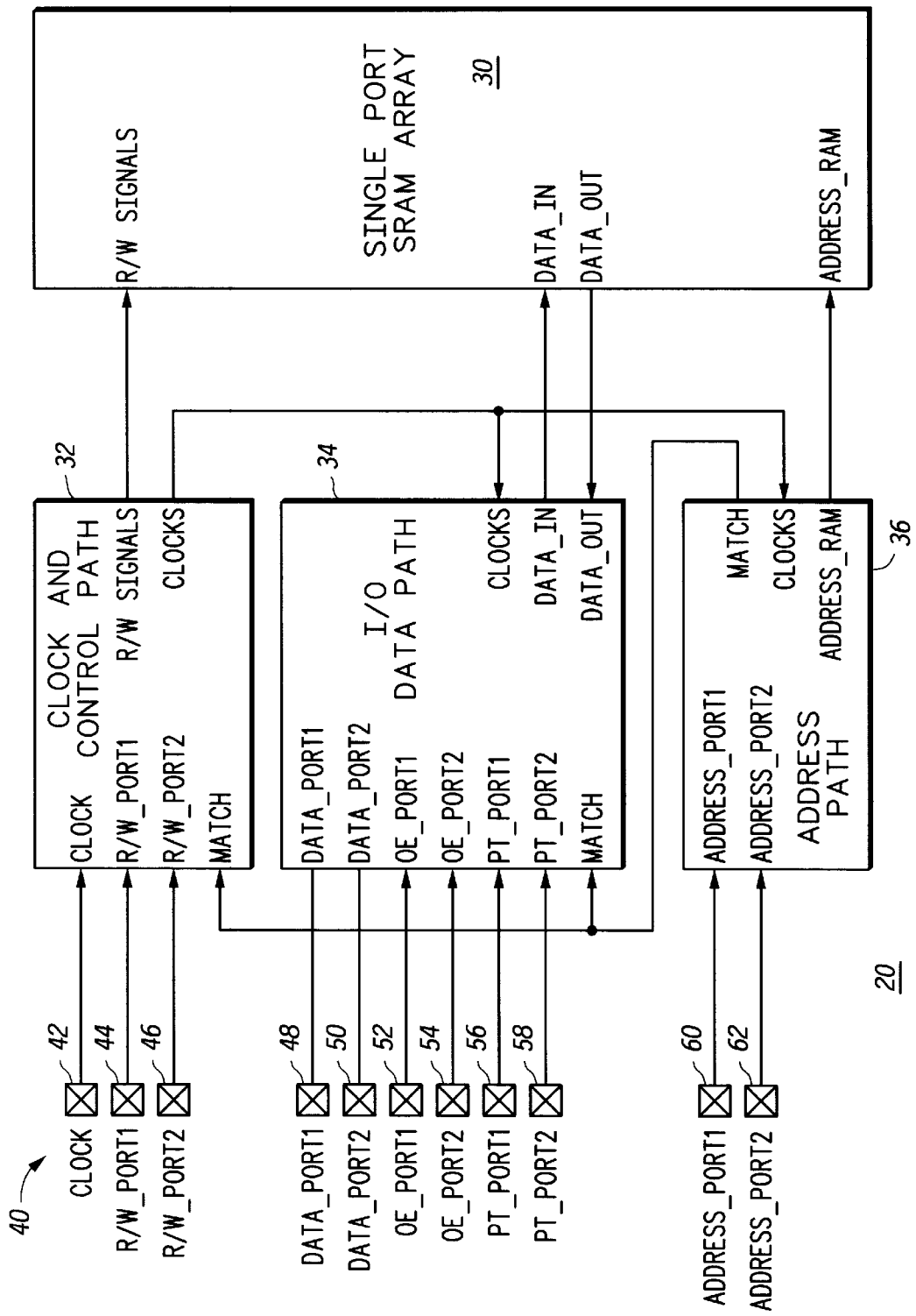
FIG. 1 illustrates in block diagram form a pipelined dual port integrated circuit memory according to the present invention.

FIG. 1 illustrates in block diagram form a pipelined dual port integrated circuit memory 20 according to the present invention. Memory 20 includes generally a single port SRAM array 30, a clock and control path 32, an input/output (I/O) data path 34, an address path 36, and a set of input and/or output bonding pads 40. The input and/or output pads are as follows: a clock input pad labelled "CLOCK" 42, a read/write input pad for PORT 1 labelled "R/W_PORT 1" 44, a read/write input pad for port 2 labelled "R/W_PORT 2" 46, a data input/output pad for PORT 1 labelled "DATA_PORT 1" 48, a data input/output pad for port 2 labelled "DATA_PORT 2" 50, an output enable input pad for PORT 1 labelled "OE_PORT 1" 52, an output enable input pad for port 2 labelled "OE_PORT 2" 54, a pass through input pad labelled "PT_PORT 1" 56, a pass through input pad for port 2 labelled "PT_PORT 2" 58, an address input pad for PORT 1 labelled "ADDRESS_PORT 1" 60, and an address input pad for port 2 labelled "ADDRESS_PORT 2" 62. As should be apparent, the data and address terminals represent multibit terminals, but are just shown as single terminals to facilitate understanding of the present invention.

Clock and control path 32 has a CLOCK input terminal connected to pad 42, a R/W_PORT1 input terminal connected to pad 44, a R/W_PORT2 input terminal connected to pad 46, an address match input terminal labelled "MATCH", a read/write output terminal labelled "R/W SIGNALS", and a clock control output terminal labelled "CLOCKS". I/O data path 34 has terminals corresponding to bonding pads 48, 50, 52, 54, 56, and 58, an input terminal for receiving signal MATCH, an input terminal for receiving signal CLOCKS, an output terminal labelled "DATA_IN", and an input terminal labelled "DATA_OUT". Address path 36 has address input terminals corresponding to ADDRESS_PORT1 pad 60 and ADDRESS_PORT2 pad 62, an output terminal for providing the MATCH signal, an input terminal for receiving the CLOCKS, and an output terminal for providing a signal labelled "ADDRESS_RAM". Note that the CLOCKS output by clock and control path 32 are not all received by each of I/O data path 34 and address path 36. The specific CLOCKS that are received by each of these blocks will be described further with reference to FIGS. 3–5 below.

Array 30 is a standard single port static random access memory array having control input terminals for receiving the R/W SIGNALS, a data input terminal connected to the DATA_IN output terminal of I/O data path 34, a data output terminal connected to the DATA_OUT input terminal of I/O data path 34, and an address input terminal for receiving the ADDRESS_RAM output of address path 36. Note that the constitution of the R/W SIGNALS will vary from embodiment to embodiment depending on the specific design of array 30 and thus these signals are designated generically. However, specific signals which are used in memory 20 will be described further with reference to FIG. 5 below.

In operation, memory 20 functions as a full dual port static random access memory (SRAM). Unlike some dual port designs which use the array partitioning technique, however, there are no circumstances in which two accesses cannot occur within a single CLOCK cycle. In addition, memory 20 uses a standard six-transistor SRAM cell and thus avoids the need for special dual ported cells associated with the other dual ported technique.

Memory 20 accomplishes these advantages by generating two accesses to access array 30 for every period of the CLOCK signal. Array 30 is a single port memory core capable of being accessed at twice the speed of the external CLOCK signal. Generally, memory 20 generates requests for access of array 30 during the first portion of a CLOCK cycle based on PORT 1 requests for access and during the second portion of a CLOCK cycle based on PORT 2 accesses. Memory 20 reverses this order in the special case of an attempted write cycle on PORT 1 during a CLOCK cycle in which there is an attempted read to the same address on PORT 2.

Figure 2:
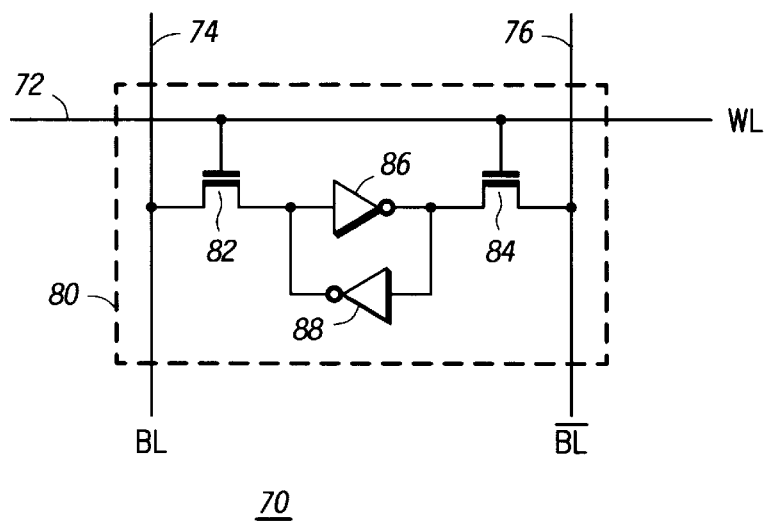
FIG. 2 illustrates in partial schematic and partial block diagram form a portion of the array of FIG. 1 including a single port static RAM cell.

The detailed operation of memory 20 will be better understood with reference to FIGS. 2–7. FIG. 2 illustrates in partial schematic and partial block diagram form a portion 70 of array 30 of FIG. 1 including a single port memory cell 80. Memory cell 80 is a static RAM cell accessed by the activation of a signal labelled "WL" conducted on a word line 72 and conducts a differential data signal labelled "BL" and "$\overline{BL}$" on a complementary pair of bit lines 74 and 76, respectively. Memory cell 80 includes N-channel metal oxide semiconductor (MOS) transistors 82 and 84, and inverters 86 and 88. Transistor 82 has a first current electrode connected to bit line 74, a gate connected to word line 72, and a second current electrode. Transistor 84 has a first current electrode connected to bit line 76, a gate connected to word line 72, and a second current electrode. Inverter 86 has an input terminal connected to the second current electrode of transistor 82, and an output terminal connected to the second current electrode of transistor 84. Inverter 88 has an input terminal connected to the output terminal of inverter 86, and an output terminal connected to the input terminal of inverter 86.

In operation, memory cell 80 is a standard single port six-transistor memory cell whose logic state is stored due to the operation of back-to-back inverters 86 and 88. Note that as described herein, the number of transistors in a memory cell includes the access transistors in addition to the transistors that perform the storage. Memory cell 80 is conventionally accessed by the activation of word line 72. When word line 72 is active, transistors 82 and 84 become conductive, coupling the contents of the memory cell as a relatively small differential voltage onto bit lines 74 and 76. This voltage is subsequently sensed and output. During a write cycle, external circuitry provides a relatively large differential voltage between BL and $\overline{BL}$ to over-write the contents stored in memory cell 80.

Memory cell 80 differs from a standard eight transistor dual ported memory cell. First, it only includes six instead of eight transistors. Second, it only is connected to a single complementary pair of bit lines instead of two separate pairs of bit lines, saving two additional access transistors. Furthermore, there is only a single word line which is able to access memory cell 80, as compared with two word lines for the dual ported memory cell. In addition to saving two transistors, the connection to only a single word line and a single bit line pair also reduces the amount of metal wiring into and out of memory cell 80. These effects allow array 30 to be constructed using relatively cheap conventional SRAM cells. Note that an array constructed using single port memory cells like memory cell 80 will be about 25% of the size of an array based on a corresponding eight-transistor true dual port memory cell.

Figure 3:
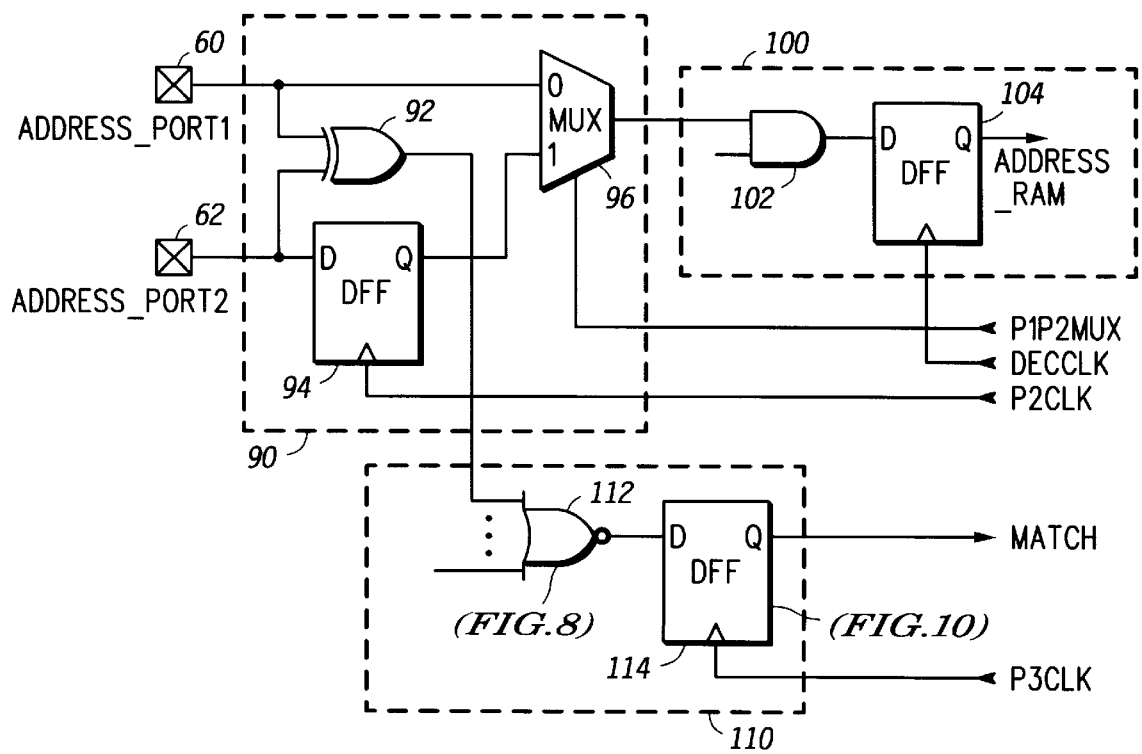
FIG. 3 illustrates in logic diagram form the address path of FIG. 1.

FIG. 3 illustrates in logic diagram form address path 36 of FIG. 1. Address path 36 includes generally an address port input stage 90, a predecoder portion 100, and an address collision detector 110. Input stage 90 includes generally an exclusive OR gate 92, a D-type flip-flop labelled "DFF" 94, and a multiplexer labelled "MUX" 96. Exclusive OR gate 92 has a first input terminal connected to pad 60 for receiving the ADDRESS_PORT1 signal, a second input terminal connected to pad 62 for receiving the ADDRESS_PORT2 signal, and an output terminal. Note that input stage 90 is a representative one of a number of input stages that correspond to the number of address bits, and corresponding to each address bit is an input stage like input stage 90 shown in FIG. 3. D flip-flop 94 has a D input terminal connected to pad 62 for receiving the ADDRESS_PORT2 signal, a clock input terminal for receiving a signal labelled "P2CLK", and a Q output terminal. MUX 96 has a first input terminal connected to pad 60 for receiving the ADDRESS_PORT1 signal, a second input terminal connected to the Q output terminal of D flip-flop 94, a control input terminal for receiving a signal labelled "P1P2MUX", and an output terminal.

Predecoder portion 100 includes an AND gate 102 and a D flip-flop 104. AND gate 102 has a first input terminal connected to the output terminal of MUX 96, a second input terminal, and an output terminal. D flip-flop 104 has a D input terminal connected to the output terminal of AND gate 102, a clock input terminal for receiving a signal labelled "DECCLK", and a Q output terminal for providing a signal labelled "ADDRESS_RAM". Note that predecoder portion 100 is representative of a logic function which may be performed during predecoding. Thus, the second input of AND gate 102 is not labelled and will vary based on what predecoding function is actually being performed, which will itself vary from embodiment to embodiment. Note further that AND gate 102 may have two, three, or more inputs or may be a different logic function based on the particular embodiment, and the output of MUX 96 is provided to several other logic gates like AND gate 102.

Address collision detector 110 includes NOR gate 112 and a D flip-flop 114. NOR gate 112 has a first input terminal connected to the output terminal of exclusive OR gate 92, and additional input terminals. Each of these additional input terminals is connected to a corresponding exclusive OR output terminal of other input stages corresponding to each of the other ADDRESS pins. NOR gate 112 also has an output terminal. D flip-flop 114 has a D input terminal connected to the output terminal of NOR gate 112, a clock input terminal for receiving a signal labelled "P3CLK", and a Q output terminal for providing the MATCH signal.

In operation, the overall function of address path 36 will be described with reference to each of the three portions illustrated in FIG. 3. Input stage 90 serves to select a given one of the first or second port's addresses for use in driving the input of array 30 as shown in FIG. 1. During one-half cycle of the CLOCK signal, one of ADDRESS_PORT1 and ADDRESS_PORT2 will be selected to be input to array 30 in a manner which will be described further below. An additional function provided by input stage 90 is to recognize when corresponding address bits are equal. The output of exclusive OR gate 92 is active when the two address bits are identical. Thus, an active low output represents a coincidence of two corresponding address bits.

As mentioned above, predecoder portion 100 performs a predecoding function for providing inputs into array 30. In other embodiments, the predecoding function may be considered to be part of array 30, but in memory 20 it is considered to be a function of address path 36. Note that during the first half of the CLOCK cycle, the address input on ADDRESS_PORT1 will be input to array 30, and D flip-flop 104 is used to register this decoded address. Also note that during the first part of a CLOCK cycle, the first input of MUX 96 is selected and thus the address on PORT 1 flows through and is registered in the register formed by D flip-flop 104. Similarly, during the first portion of the clock cycle, the address conducted on ADDRESS_PORT2 is registered, but in this case is registered in the register formed by D flip-flop 94. During the second portion of the CLOCK cycle, the address conducted on PORT 2 and stored in D flip-flop 94 is selected through the second input of MUX 96 and then is registered in D flip-flop 104 in order to drive the predecoded address into array 30.

Unlike input stage 90 and predecoder portion 100, address collision detector 110 is shared between all address input bits. NOR gate 112 detects the condition in which each address bit of both the PORT 1 and PORT 2 addresses coincide and provides an active high signal to indicate this MATCH condition. D flip-flop 114 is used to store this control signal coincident with clock signal P3CLK.

Figure 4:
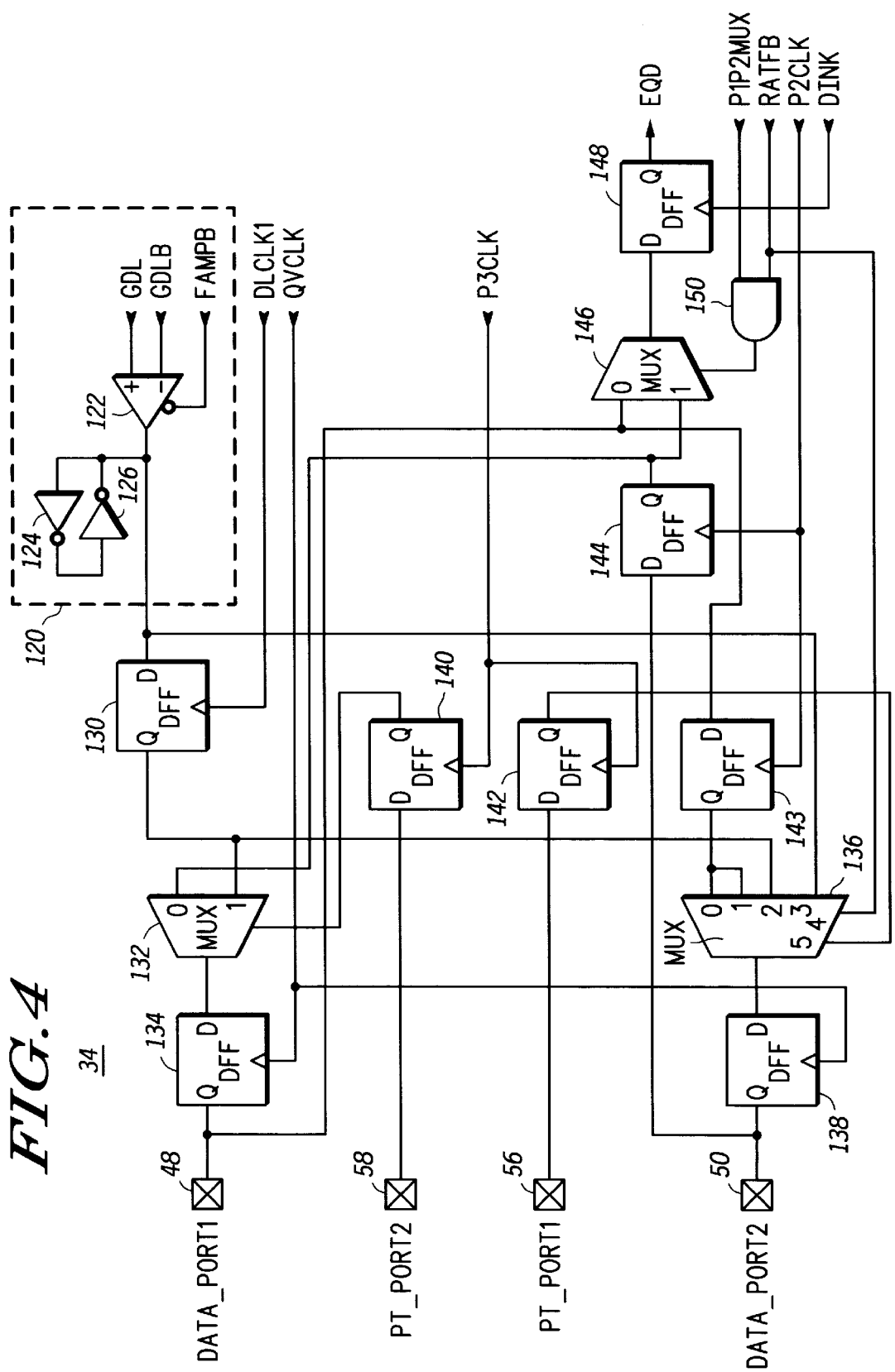
FIG. 4 illustrates in logic diagram form the I/O data path of FIG. 1.

FIG. 4 illustrates in logic diagram form I/O data path 34 of FIG. 1. I/O data path 34 includes generally a self-timed amplifier 120, a D flip-flop 130, a MUX 132, a D flip-flop 134, a MUX 136, D flip-flops 138, 140, 142, 143, and 144, a MUX 146, a D flip-flop 148, and an AND gate 150. Self-timed amplifier 120 includes a sense amplifier 122 and inverters 124 and 126. Sense amplifier 122 has a positive input terminal for receiving a signal labelled "GDL", a negative input terminal for receiving a signal labelled "GDLB", an active-low control input terminal for receiving signal labelled "FAMPB", and an output terminal. Note that here and in the following text a signal having a "B" appended to the end of it represents an active low signal. Signals GDL and GDLB are signals conducted on complementary global data lines in array 30 which represent the contents of a memory cell selected by row and column decoding, and correspond to the DATA_OUT signals of FIG. 1. Inverter 124 has an input terminal connected to the output terminal of sense amplifier 122, and an output terminal. Inverter 126 has an input terminal connected to the output terminal of inverter 124, and an output terminal connected to the input terminal of inverter 124.

D flip-flop 130 has a D input terminal connected to the output terminal of sense amplifier 122, a clock input terminal for receiving a signal labelled "DLCLK1", and a Q output terminal. MUX 132 has a first input terminal labelled "0", a second input terminal labelled "1" connected to the Q output terminal of D flip-flop 130, a control input terminal, and an output terminal. D flip-flop 134 has a D input terminal connected to the output terminal of MUX 132, a clock input terminal for receiving a signal labelled "QVCLK", and a Q output terminal connected to pad 48 for providing signal DATA_PORT1 thereto.

MUX 136 has a first input terminal labelled "0", a second input terminal labelled "1", a third input terminal labelled "2" connected to the Q output terminal of D flip-flop 130, a fourth input terminal labelled "3" connected to the output terminal of sense amplifier 122, a first control input terminal labelled "4" for receiving a signal labelled "RATFB", a second control input terminal labelled "5", and an output terminal. D flip-flop 138 has a D input terminal connected to the output terminal of MUX 136, a clock input terminal for receiving signal QVCLK, and a Q output terminal connected to pad 50 for providing signal DATA_PORT2 thereto.

D flip-flop 140 has a D input terminal connected to pad 58 for receiving signal PT_PORT2, a clock input terminal for receiving signal P3CLK, and a Q output terminal connected to the control input terminal of MUX 132. D flip-flop 142 has a D input terminal connected to pad 56 for receiving signal PT_PORT1, a clock input terminal for receiving signal P3CLK, and a Q output terminal connected to the second control input terminal of MUX 136. D flip-flop 143 has a D input terminal connected to the Q output terminal of D flip-flop 134, a clock input terminal for receiving a signal labelled "P2CLK", and a Q output terminal connected to both the first and second input terminals of MUX 136. D flip-flop 144 has a D input terminal connected to pad 50 for receiving signal DATA_PORT 2, a clock input terminal for receiving signal P2CLK, and a Q output terminal connected to the first input terminal of MUX 132. MUX 146 has a first input terminal connected to the Q output terminal of D flip-flop 134, a second input terminal connected to the Q output terminal of D flip-flop 144, a control input terminal, and an output terminal. D flip-flop 148 has a D input terminal connected to the output terminal of MUX 146, a clock input terminal for receiving a signal labelled "DINK", and a Q output terminal for providing a signal labelled "EQD". AND gate 150 has a first input terminal for receiving signal P1P2MUX, a second input terminal for receiving signal RAFTB, and an output terminal connected to the control input terminal of MUX 146. Note that signal EQD corresponds to DATA_IN of FIG. 1. Signals FAMPB, DLCLK1, QVCLK, P3CLK, P1P2MUX, RATFB, P2CLK, and DINK correspond to CLOCKS from FIG. 1.

In operation, I/O data path 34 is connected to four different signal bonding pads, one each for data from DATA_PORT1 and DATA_PORT2, and two control signals, PT_PORT1 and PT_PORT2. These control signals are pass-through signals which control the pass through of data from one port to the other. Thus, when signal PT_PORT2 is active at a logic low, then the output of D flip-flop 140 causes MUX 132 to select the first input thereof which represents the DATA_PORT2 signal from pad 50 which will be provided through D flip-flop 134 to pad 48 as the DATA_PORT1 signal. Conversely, when signal PT_PORT1 is active at a logic low at the input of D flip-flop 142, the Q output thereof controls MUX 136 to select the first and second inputs of MUX 136 which, through D flip-flop 143, represents the DATA_PORT1 signal from pad 48, and outputs that bit through D flip-flop 138 to pad 50 as the DATA_PORT2 signal.

Now the operation of I/O data path 34 when not operating in pass-through mode will be described. Self-timed amplifier 120 is used to sense output data from array 30 during a read cycle. The output of self-timed amplifier 120 is input to both the D input terminal of D flip-flop 130 and the D input terminal of D flip-flop 138, through the fourth input terminal of MUX 136. Thus, data from memory array 30 is selectively provided to either pad 48 as signal DATA_PORT1 or to pad 50 as signal DATA_PORT2 during a read cycle depending upon which port is currently accessing the array.

Additional circuitry is used during a write cycle. MUX 146 selects either signal DATA_PORT1 from pad 48 or signal DATA_PORT2 from pad 50 (which is registered in D flip-flop 144). The selection is based on signal P1P2MUX logically ANDed with signal RATFB. Signal RATFB indicates the match condition and will be described further below. The selected input data then is registered by signal DINK in D flip-flop 148 and driven into array 30 as signal EQD.

Figure 5:
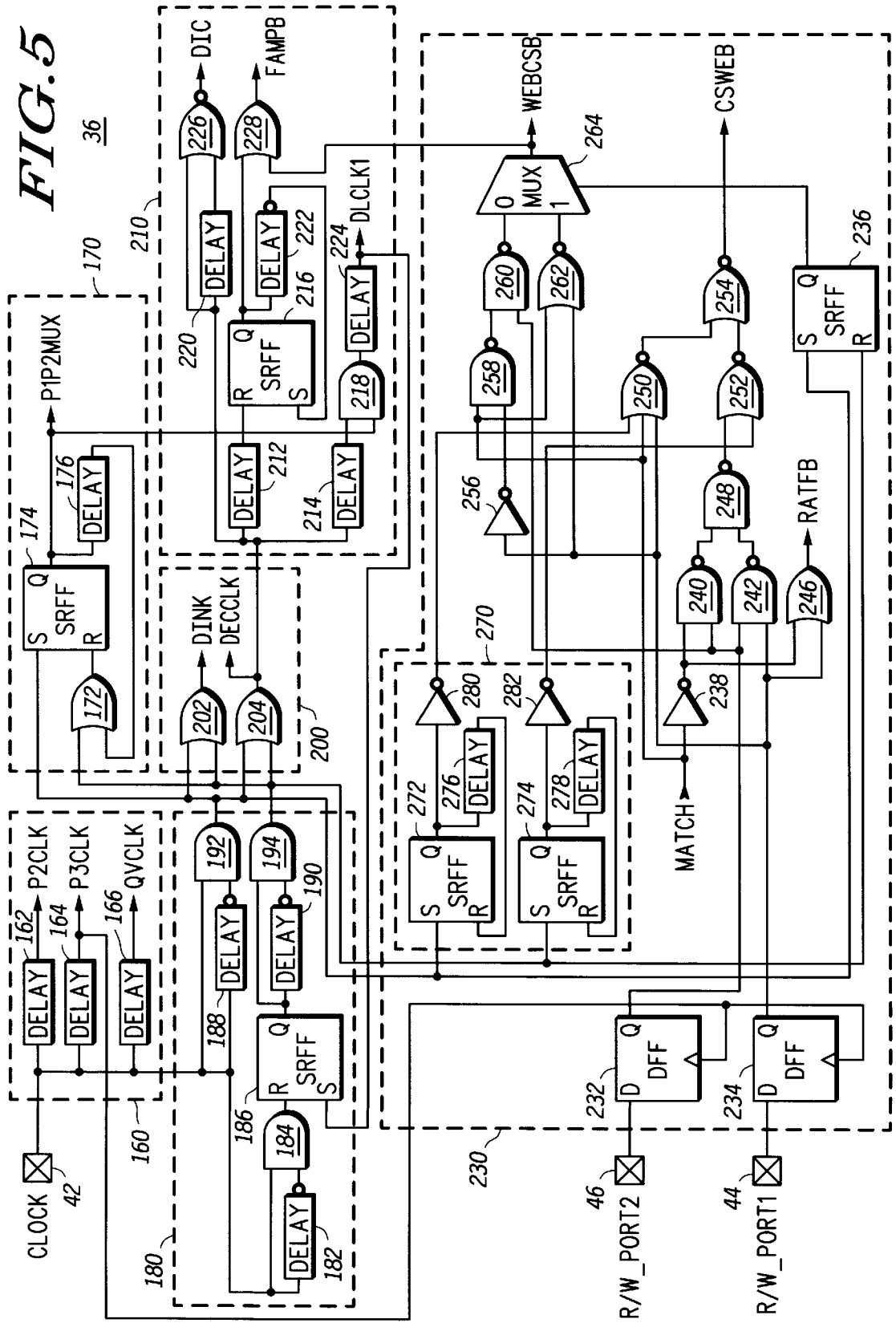
FIG. 5 illustrates in logic diagram form the clock and control path of FIG. 1.

FIG. 5 illustrates in logic diagram form clock and control path 32 of FIG. 1. In general, clock and control path 32 includes an I/O clock portion 160, a self-synchronizing port select circuit 170, a master clock circuit 180, a data and address clock circuit 200, a self-timed read clock and control logic circuit 210, and a read/write control circuit 230. I/O clock portion 160 includes delay elements 162, 164, and 166, each of which has an input terminal connected to pad 42 for receiving the CLOCK signal, and an output terminal. Delay element 162 has an output terminal for providing signal P2CLK. Delay element 164 has an output terminal for providing signal P3CLK. Delay element 166 has an output terminal for providing signal QVCLK.

Self-synchronizing port select circuit 170 includes an OR gate 172, an SR flip-flop (SRFF) 174, and a delay element 176. OR gate 172 has a first input terminal, a second input terminal, and an output terminal. SR flip-flop 174 has a set terminal labelled "S", a reset input terminal labelled "R" connected to the output terminal of OR gate 172, and an output terminal labelled "Q" for providing signal P1P2MUX. Delay element 176 has an input terminal connected to the Q output terminal of SR flip-flop 174, and an output terminal connected to the second input terminal of OR gate 172.

Master clock circuit 180 includes a delay element 182, an AND gate 184, an SR flip-flop 186, delay elements 188 and 190, and AND gates 192 and 194. Delay element 182 has an input terminal connected to pad 42 for receiving the CLOCK signal, and a complementary output terminal. AND gate 184 has a first input terminal connected to pad 42 for receiving the CLOCK signal, a second input terminal connected to the complementary output terminal of delay element 182, and an output terminal. SR flip-flop 186 has an S input terminal for receiving signal DLCLK1, an R input terminal connected to the output terminal of AND gate 184, and a Q output terminal. Delay element 188 has an input terminal connected to pad 42 for receiving the CLOCK signal, and a complementary output terminal. Delay element 190 has an input terminal connected to the Q output terminal of SR flip-flop 186, and a complementary output terminal. AND gate 192 has a first input terminal connected to pad 42 for receiving the CLOCK signal, a second input terminal connected to the complementary output terminal of delay element 188, and an output terminal connected to the S input terminal of SR flip-flop 174. AND gate 194 has a first input terminal connected to the Q output terminal of SR flip-flop 186, a second input terminal connected to the complementary output terminal of delay element 190, and an output terminal connected to the first input terminal of OR gate 172.

Data and address clock circuit 200 includes an OR gate 202 and an OR gate 204. OR gate 202 has a first input terminal connected to the output terminal of AND gate 192, a second input terminal connected to the output terminal of AND gate 194, and an output terminal for providing signal DINK. OR gate 204 has a first input terminal connected to the output terminal of AND gate 192, a second input terminal connected to the output terminal of AND gate 194, and an output terminal for providing signal DECCLK.

Self-timed read clocks and control logic circuit 210 includes delay elements 212 and 214, an SR flip-flop 216, an AND gate 218, delay elements 220, 222, and 224, a NOR gate 226, and an OR gate 228. Delay element 212 has an input terminal connected to the output terminal of OR gate 204, and an output terminal. Delay element 214 has an input terminal connected to the output terminal of OR gate 204, and an output terminal. SR flip-flop 216 has an R input terminal connected to the output terminal of delay element 212, an S input terminal, and a Q output terminal. AND gate 218 has a first input terminal connected to the output terminal of delay element 214, a second input terminal connected to the Q output terminal of SR flip-flop 174, and an output terminal. Delay element 220 has an input terminal connected to the output terminal of OR gate 204, and an output terminal. Delay element 222 has an input terminal connected to the Q output terminal of SR flip-flop 216, and a complementary output terminal connected to the S input terminal of SR flip-flop 216. Delay element 224 has an input terminal connected to the output terminal of AND gate 218, and an output terminal for providing signal DLCLK1. NOR gate 226 has a first input terminal connected to the output terminal of OR gate 204, a second input terminal connected to the output terminal of delay element 220, and an output terminal for providing a signal labelled "DIC". OR gate 228 has a first input terminal connected to the Q output terminal of SR flip-flop 216, a second input terminal, and an output terminal for providing a signal labelled "FAMPB".

Read/write control circuit 230 includes D flip-flops 232 and 234, an SR flip-flop 236, an inverter 238, NAND gates 240 and 242, an OR gate 246, a NAND gate 248, NOR gates 250, 252, and 254, an inverter 256, NAND gates 258 and 260, a NOR gate 262, a MUX 264, and a self-timed write clocks circuit 270. D flip-flop 232 has a D input terminal connected to pad 46 for receiving signal R/W_PORT2, a clock input terminal for receiving signal P3CLK, and a Q output terminal. D flip-flop 234 has a D input terminal connected to pad 44 for receiving signal R/W_PORT1, a clock input terminal for receiving signal P3CLK, and a Q output terminal. SR flip-flop 236 has an S input terminal connected to the output terminal of AND gate 192, an R input terminal connected to the output terminal of AND gate 194, and a Q output terminal.

Inverter 238 has an input terminal for receiving signal MATCH, and an output terminal. NAND gate 240 has a first input terminal connected to the output terminal of inverter 238, a second input terminal connected to the Q output terminal of D flip-flop 232, and an output terminal. NAND gate 242 has a first input terminal connected to the Q output terminal of D flip-flop 232, a second input terminal connected to the Q output terminal of D flip-flop 234, and an output terminal. OR gate 246 has a first input terminal connected to the output terminal of inverter 238, a second input terminal connected to the Q output terminal D flip-flop 234, and an output terminal for providing signal RATFB. NAND gate 248 has a first input terminal connected to the output terminal of NAND gate 240, a second input terminal connected to the output terminal of NAND gate 242, and an output terminal. NOR gate 250 has a first input terminal, a second input terminal for receiving signal MATCH, a third input terminal connected to the Q output terminal of D flip-flop 234, and an output terminal. NOR gate 252 has a first input connected to the output terminal of NAND gate 248, a second input terminal, and an output terminal. NOR gate 254 has a first input terminal connected to the output terminal of NOR gate 250, a second input terminal connected to the output terminal of NOR gate 252, and an output terminal for providing a signal labelled "CSWEB".

Inverter 256 has an input terminal connected to the Q output terminal of D flip-flop 234, and an output terminal. NAND gate 258 has a first input terminal for receiving signal MATCH, a second input terminal connected to the output terminal of inverter 256, and an output terminal. NAND gate 260 has a first input terminal connected to the output terminal of NAND gate 258, a second input terminal connected to the Q output terminal of D flip-flop 232, and an output terminal. NOR gate 262 has a first input terminal for receiving signal MATCH, a second input terminal connected to the Q output terminal of D flip-flop 232, and an output terminal. MUX 264 has a first input terminal connected to the output terminal of NAND gate 260, a second input terminal connected to the output terminal of NOR gate 262, a control input terminal connected to the Q output terminal of SR flip-flop 236, and an output terminal connected to the second input terminal of OR gate 228 for providing a signal labelled "WEBCSB".

Self timed write clocks circuit 270 includes SR flip-flops 272 and 274, delay elements 276 and 278, and inverters 280 and 282. SR flip-flop 272 has an S input terminal connected to the output terminal of AND gate 192, an R input terminal, and a Q output terminal. SR flip-flop 274 has an S input terminal connected to the output terminal of AND gate 194, an R input terminal, and a Q output terminal. Delay element 276 has an input terminal connected to the Q output terminal of SR flip-flop 272, and an output terminal connected to the R input terminal of SR flip-flop 272. Delay element 278 has an input terminal connected to the Q output terminal of SR flip-flop 274, and an output terminal connected to the R input terminal of SR flip-flop 274. Inverter 280 has an input terminal connected to the Q output terminal of SR flip-flop 272, and an output terminal connected to the first input terminal of NOR gate 250. Inverter 282 has an input terminal connected to the Q output terminal of SR flip-flop 274, and an output terminal connected to the second input terminal of NOR gate 252.

Now the operation of clock and control path 32 will be described briefly with reference to the circuit structure shown in FIG. 5. However additional details of the operation will be explained further with reference to FIGS. 6 and 7 below. I/O clock portion 160 generates three clock signals which are all based on the input CLOCK. Delay elements 162, 164, and 166 provide different amounts of delay in generating signals P2CLK, P3CLK, and QVCLK, respectively. The relative timing relationship between these signals and the clock signal will be explained further below.

Self-synchronizing port select circuit 170 functions essentially as a one-bit counter to alternate accesses between PORT 1 and PORT 2. In general, the first part of a cycle defined by signal CLOCK will be generated by PORT 1 and the second cycle by PORT 2. Note that delay element 176 is used to insure that signal P1P2MUX starts in a logic low condition when power is first applied. After power-up, the state of the Q output signal of SR flip-flop 174 is indeterminate. However, delay element 176 and the additional logic input to OR gate 172 ensure that SR flip-flop 174 is reset to a logic 0 during this first cycle, and thus that signal P1P2MUX is registered as a logic low before the first access occurs.

Master clock circuit 180 is used to generate two clocks, at the output of AND gates 192 and 194, respectively, in which the output of AND gate 192 represents a trigger signal for a cycle 1 access and the output of AND gate 194 represents a trigger for a cycle 2 access. Note that the combination of an AND gate and corresponding delay elements forms a one-shot and therefore on a low-to-high transition of the CLOCK, the one-shot formed by delay element 188 and AND gate 192 provides an output to signify a trigger for the first cycle. At the end of the first cycle, self-timed read clocks and control logic circuit 210 activates signal DLCLK1 which causes SR flip-flop 186 to be set. When the Q output thereof transitions to a logic high, AND gate 194 outputs the trigger signal associated with the second cycle. When the CLOCK signal again transitions to logic high, the output of AND gate 184 will become a logic high, thereby resetting SR flip-flop 186. Note that throughout clock and control path 32, one shots are used to ensure that the circuitry is edge triggered. Thus, if the CLOCK signal is static by being held at a given logic state, no timing signals will be generated.

Data and address clock circuit 200 provides data input clock signal DINK to data path 34 and signal predecoder clock signal DECCLK to address path 36. Note that signals DINK and DECCLK are logically identical, but are output through separate OR gates in order to allow signal DECCLK to propagate as quickly as possible without the additional loading on the signal line driven by OR gate 202. Self-timed read clocks and control logic circuit 210 is used to generate three clocks which are important in various other operations including clocks DIC, FAMPB, and DLCLK1. Signal DIC is a decoder inhibit clock which is used to disable all decoders at the end of cycle 2 or cycle 1. Signal FAMPB is used to enable back-end sensing and signal DLCLK1 is used to register cycle 1 data as well as signaling the beginning of cycle 2.

Read/write control circuit 230 is used to provide control signals to drive array 30. The first signal is WEBCSB which indicates a pending read cycle. The second signal is CSWEB which indicates a pending write cycle. A "CYCLE 1" access to array 30 is an access which occurs during a first portion of the CLOCK cycle, and a "CYCLE 2" access is an access which follows the CYCLE 1 access during the CLOCK cycle. Normally a PORT 1 access occurs during CYCLE 1 and a PORT 2 access occurs during CYCLE 2. Signal RATFB is activated at a logic low if there is a match between PORT 1 and PORT 2 addresses and the access on PORT 1 is a write cycle. Signal RATFB is used to reverse the order of the PORT 1 and PORT 2 accesses such that during cycle 1 the PORT 2 access takes place and during cycle 2 the PORT 1 access takes place. Thus, memory 20 follows a read-before-write protocol.

The operation of memory 20 during various cycle combinations can be understood with reference to TABLE I below:

TABLE I

| Case | PORT 1 | PORT 2 | MATCH | CYCLE 1 | CYCLE 2 |
| --- | --- | --- | --- | --- | --- |
| 1 | R | R | N | R1 | R2 |
| 2 | R | W | N | R1 | W2 |
| 3 | W | R | N | W1 | R2 |
| 4 | W | W | N | W1 | W2 |
| 5 | R | R | Y | R1 | R2 |
| 6 | R | W | Y | R1 | W2 |
| 7 | W | R | Y | R2 | W1 |
| 8 | W | W | Y | W1 | W1 | in which "R" represents a read access, "W" represents a write access, "R1" represents a read access from PORT 1, "N" represents the no-match condition, and "Y" represents the match condition. So for example case 1 represents simultaneous read accesses on PORT 1 and PORT 2, but to different addresses. In this case, the PORT 1 access to array 30 occurs during CYCLE 1 and the port 2 read access occurs during CYCLE 2. In general, the access to PORT 1 occurs during CYCLE 1, and the access to PORT 2 occurs during CYCLE 2. However since memory 20 follows a read-before-write protocol, when PORT 1 attempts to write the same address that PORT 2 attempts to read, the PORT 2 access occurs during CYCLE 1 and the PORT 1 access occurs during CYCLE 2. Furthermore when PORT 1 and PORT 2 attempt to write the same address, the PORT 1 write takes precedence.

Figure 6:
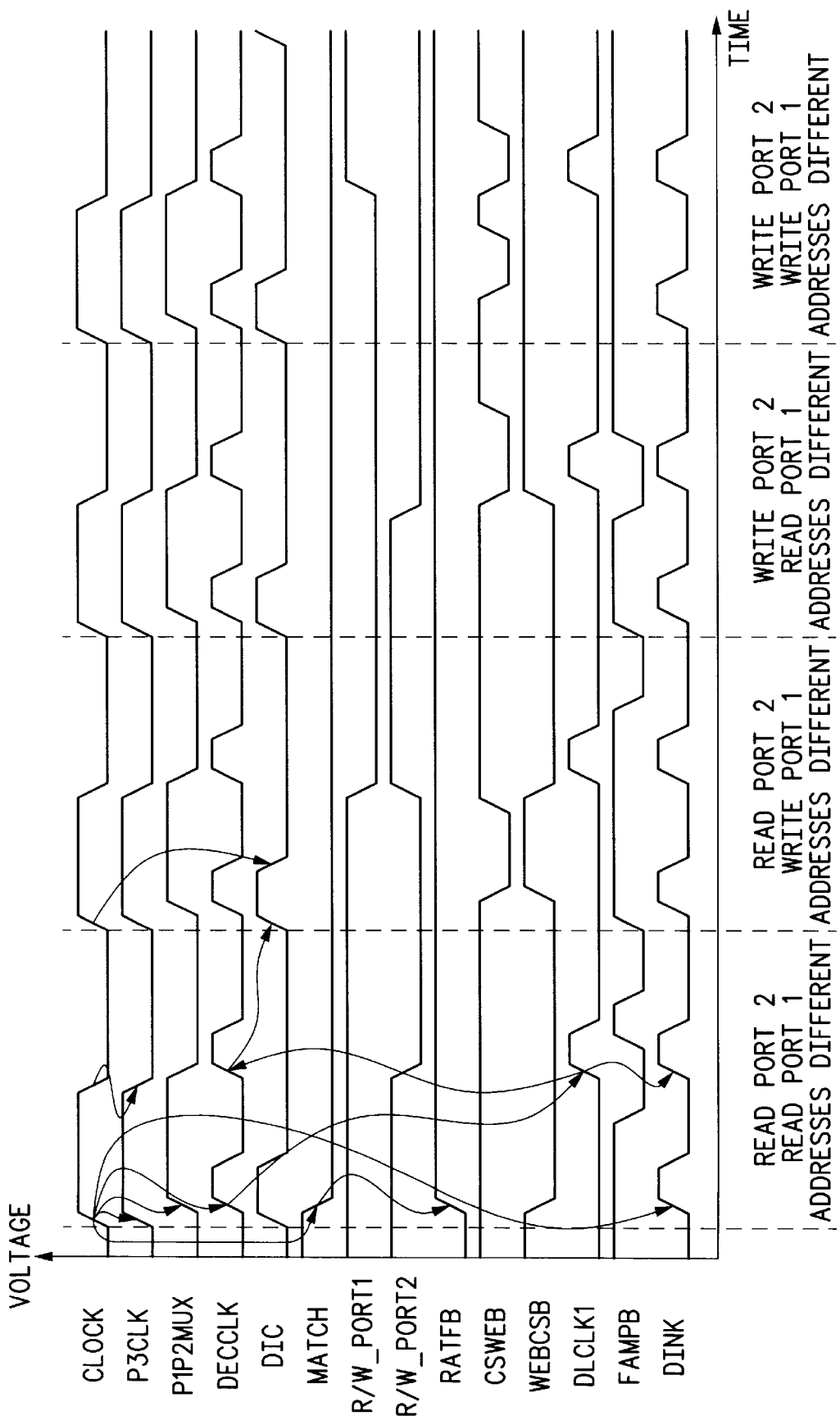
FIG. 6 illustrates in timing diagram form signals which are relevant to understanding the operation of the memory of FIG. 1 during non-match cycles.
Figure 7:
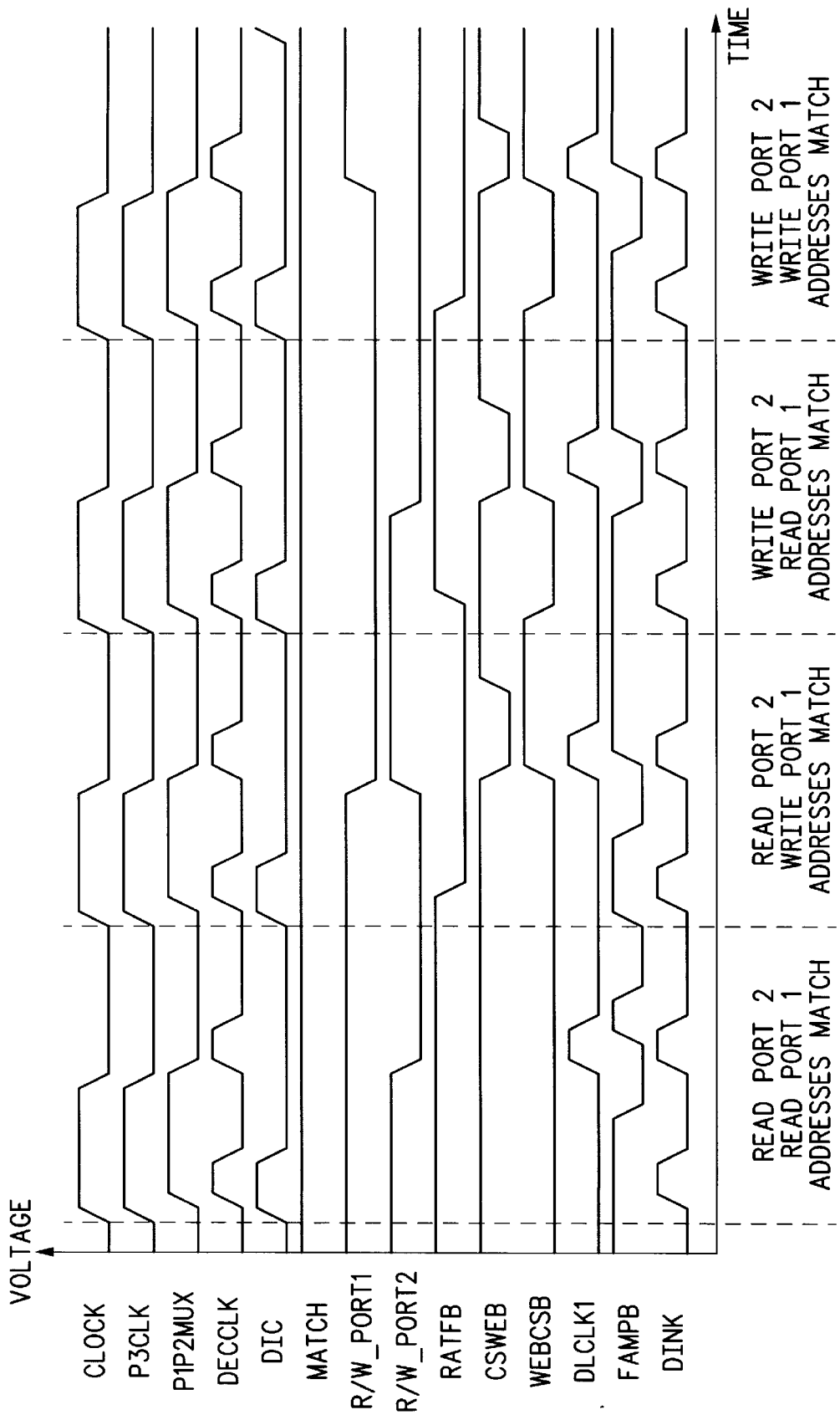
FIG. 7 illustrates in timing diagram form signals which are relevant to understanding the operation of the memory of FIG. 1 during match cycles.

TABLE 1 is better understood with reference to FIGS. 6 and 7, which illustrate in timing diagram form signals which are relevant to understanding the operation of memory 20 of FIG. 1 during non-match (cases 1–4) and match (cases 5–8) cycles, respectively. Now considering FIGS. 6 and 7 together, note that since memory 20 is a synchronous memory, the CLOCK signal functions as a master clock signal which initiates all other clock signals. These dependencies are illustrated during the first case only, but hold for all other cases as well. A low-to-high transition of the CLOCK signal initiates the CYCLE 1–CYCLE 2 sequence. The high-to-low transition does not affect the start of CYCLE 2. Signal P1P2MUX is initially at a logic low for CYCLE 1 and at a logic high for CYCLE 2. Each CLOCK transition causes the activation of the pulsed DECCLK signal, which causes the predecoded address signals to be latched in the address path. Note that the timing signals which are illustrated in TABLE 1 and FIGS. 6 and 7 are a sufficient set of timing signals to control the major operation of memory 20, but will vary from embodiment to embodiment.

Throughout the following descriptions, the terms VDD and VSS refer to power supply voltages where VDD is more positive than VSS. In one embodiment, VDD is approximately 3.3 volts and VSS is approximately 0 volts; however, alternate embodiments may use different values for VDD and VSS. Note also that the terms transmission gate and pass gate have been used interchangeably herein. The true control terminal of a pass gate refers to the gate of the N-channel MOSFET transistor, and the inverted control terminal refers to the gate of the P-channel MOSFET transistor. In addition to two control terminals, a transmission gate also has a first data terminal and a second data terminal. Furthermore, the terms logic level low and logic level high correspond to logic level zero and logic level one, respectively. If the logic level one indicates a logically true state, then the logic level zero will indicate a logically false state. And if the logic level zero indicates a logically true state, then the logic level one will indicate a logically false state. VBE (base to emitter voltage) is defined as the voltage difference between the base and emitter of a conducting bipolar transistor. In the embodiments illustrated in FIGS. 8–11, logic levels refer to near CMOS (complementary metal oxide semiconductor) or BICMOS (bipolar/complementary metal oxide semiconductor) levels which swing from a logic high voltage equal to near VDD to a logic low voltage equal to near VSS. In alternate embodiments, various other logic levels with different voltage swings may be used depending on the circuit's design.

Figure 8:
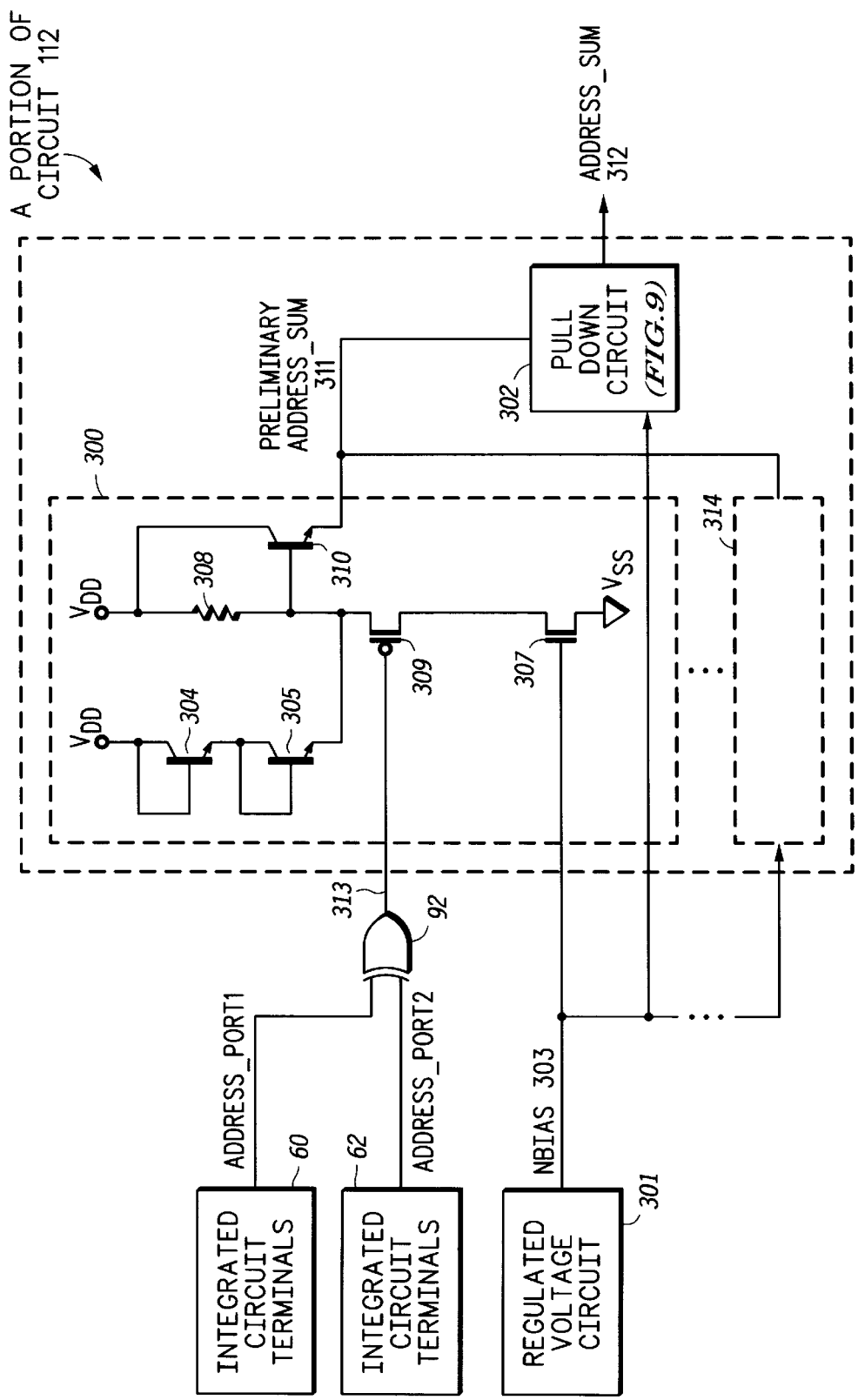
FIG. 8 illustrates in partial schematic and partial block diagram form one embodiment of a portion of the logic diagram of FIG. 3.

FIG. 8 illustrates in partial schematic and partial block diagram form a portion of the logic diagram of FIG. 3. One bit of integrated circuit terminals 60 and one bit of integrated circuit terminals 62 are inputs to the exclusive-OR (XOR) gate 92. The output of XOR gate 92 is connected to the gate of the P-channel MOSFET transistor 309. A first current electrode of transistor 309 is connected to a first terminal of resistor 308 and to the emitter of NPN bipolar transistor 305. The second terminal of resistor 308 is connected to both VDD and the collector of NPN bipolar transistor 310. The base of transistor 310 is connected to the first current electrode of transistor 309. The emitter of transistor 310 is connected to PRELIMINARY ADDRESS_SUM 311, which is an input to pull-down circuit 302. The second current electrode of MOSFET transistor 309 is connected to the first current electrode of N-channel MOSFET transistor 307. NBIAS 303 is an output of regulated voltage circuit 301 and is connected to the gate of transistor 307. The second current electrode of transistor 307 is connected to VSS. The base of transistor 305 is connected to the collector of transistor 305 and to the emitter of NPN bipolar transistor 304. The base of transistor 304 is connected to the collector of transistor 304 and to VDD. NBIAS 303 is an input to pull-down circuit 302, and ADDRESS_SUM 312 is an output of pull-down circuit 302. Level shifter 300 includes transistors 304, 305, 307, 309, 310, and resistor 308. In one embodiment, a portion of NOR gate 112 includes level shifter 300 and pull-down circuit 302. Note that NOR gate 112 may alternately be an OR gate coupled to the complemented input of D flip-flop 114.

Since ADDRESS_PORT1 and ADDRESS_PORT2 represent multi-bit terminals, there is a level shifter identical to level shifter 300 and an XOR gate identical to XOR gate 92 for each corresponding address bit. For example, if the address ports are 8-bit terminals, there would be eight instantiations of level shifter 300 and XOR gate 92. Circuit 314 could therefore include a circuit identical to level shifter 300. NBIAS 303 would be an input to each of the level shifters, and all the outputs of the level shifters would be connected to PRELIMINARY ADDRESS_SUM 311. In alternate embodiments, the circuits corresponding to each address bit can vary. Circuit 314 may include a circuit that is different from level shifter 300, and another logic gate or combination of logic gates can replace any or all of the XOR gates (e.g. XOR gate 92).

In operation, when the address bits on ADDRESS_PORT1 match the address bits on ADDRESS_PORT2, the output of XOR 92 is at a logic level low. The output of level shifter 300 is wire-ORed with the outputs of the other level shifters. PRELIMINARY ADDRESS_SUM 311 will be pulled low if the output of every XOR gate is a logic level low. If any one output from the XOR gates, such as XOR 92, is a logic level high, PRELIMINARY ADDRESS_SUM 311 will also be pulled high. Therefore, the wire-ORed system works similar to an n-input logic OR gate.

Since level shifter 300 cannot pull down the output, PRELIMINARY ADDRESS_SUM 311, a pull-down circuit 302 accomplishes this function. Pull-down circuit 302 also provides an additional voltage drop from PRELIMINARY ADDRESS_SUM 311 to ADDRESS_SUM 312 in order to correctly bias the output signal, ADDRESS_SUM 312, for the subsequent circuits. Level shifter 300 also converts the logic level output of XOR gate 92 to a small signal; therefore, PRELIMINARY ADDRESS_SUM 311 and ADDRESS_SUM 312 end up as small signals. "Small signal" is defined to mean that the voltage difference between a logic level high and a logic level low is a few hundred millivolts or less.

If the gate electrode of transistor 309 is pulled high (to a voltage of nearly VDD), the voltage on the base of transistor 310 would be essentially VDD. If the gate electrode of transistor 309 is pulled low, the transistor 309 turns on and the base of transistor 310 would be pulled low. When the circuit is operating at normal voltages (within the operating specifications) and the base of transistor 310 is pulled low, the base of bipolar transistor 310 would then be "VDD–IR", where R is the resistance value of resistor 308 and I is the current through resistor 308 which is determined by the gate-source voltage of transistor 309. When the base is pulled low and the circuit is operating at high VDD voltages, defined as voltages higher than the maximum operating voltage allowed by the operating specifications, the base of bipolar transistor 310 would be "VDD−IR", where I is the current through resistor 308 (now determined by transistor 307 as well as transistors 304 and 305 if the clamp is operating). This will be discussed further herein below.

At high VDD, transistor 307 acts as a current source to limit the "IR" drop across resistor 308. As mentioned above, transistor 310 is an emitter follower which provides a voltage drop of one $V_{BE}$ (base to emitter voltage), as well as allows for wire-OR capability. Having an emitter follower also allows for a quick pull-up of PRELIMINARY ADDRESS_SUM 311.

Transistors 304 and 305 do not effect the logic functionality of level shifter 300, but act as a voltage clamp for transistor 310. Transistors 304 and 305 protect transistor 310 from receiving a high emitter to base voltage by limiting the lowest voltage possible at the base of transistor 310. A high emitter to base voltage is dangerous because it can destroy or permanently alter the transistor. Other embodiments may use other designs to accomplish the same function as transistors 304 and 305. For example, diodes may be used instead.

Figure 9:
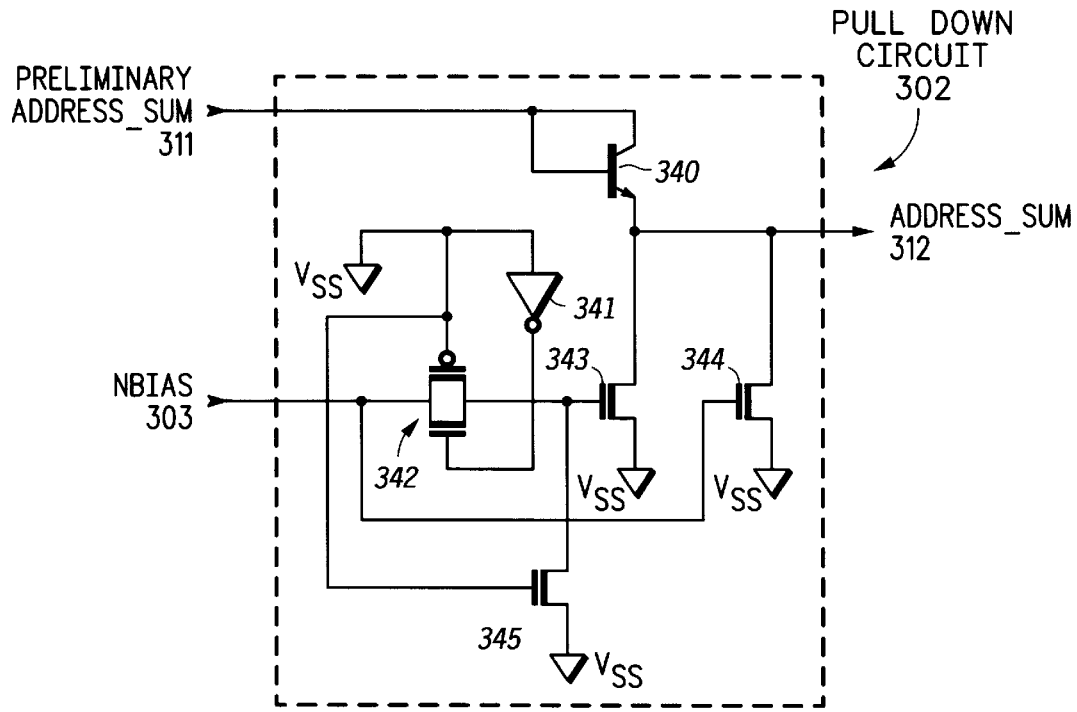
FIG. 9 illustrates in schematic diagram form one embodiment of pull-down circuit 302 of FIG. 8.

FIG. 9 illustrates in schematic form the pull-down circuit 302 of FIG. 8. PRELIMINARY ADDRESS_SUM 311 is connected to the base and collector of NPN bipolar transistor 340. The emitter of transistor 340 is connected to ADDRESS_SUM 312, to the first current electrode of N-channel MOSFET transistor 344, and to the first current electrode of N-channel MOSFET transistor 343. The second current electrode of transistor 344 and the second current electrode of transistor 343 are connected to VSS. NBIAS 303 is connected to the gate of transistor 344 and to the first data terminal (input) of pass gate 342. The second data terminal (output) of pass gate 342 is connected to the gate of transistor 343 and to the first current electrode of N-channel MOSFET transistor 345. The second current electrode of transistor 345 is connected to VSS. VSS is coupled to both the inverted control terminal of pass gate 342 and to the input of inverter 341. The output of inverter 341 is connected to the true control terminal of pass gate 342. The gate of transistor 345 is connected to the inverted control terminal of pass gate 342. Pull-down circuit 302 includes transistor 340, 343, 344, 345, pass gate 342, and inverter 341.

In operation, the pull down circuit 302 supplies a current from PRELIMINARY ADDRESS_SUM 311 to VSS. When the output of every XOR gate (like XOR gate 92) is a logic level low, then the current in pull down circuit 302 brings PRELIMINARY ADDRESS_SUM 311 low. Generally, a high logic level PRELIMINARY ADDRESS_SUM 311 corresponds to a voltage "VDD−1$V_{BE}$", where $V_{BE}$ refers to the $V_{BE}$ of transistor 310 and is usually approximately between 0.7V and 0.8V. A low logic level PRELIMINARY ADDRESS_SUM 311 corresponds to a voltage "VDD−IR−$V_{BE}$", where I is the current through resistor 308 (determined by transistors 304, 305, 307, and 309), R is the resistance value of resistor 308, and $V_{BE}$ is the $V_{BE}$ of transistor 310. Once again, $V_{BE}$ is usually between approximately 0.7V and 0.8V. In one embodiment, the "IR" value is approximately between 0.8V and 1.0V, but can vary significantly depending on the circuit design. The better the design of the differential amplifier 360, the less of a difference is needed between the high and low voltage values of PRELIMINARY ADDRESS_SUM 311, but there are tradeoffs to be considered. The smaller the "IR" voltage drop, the faster the level shifter 300 operates, but at the same time, the differential amplifier 360 becomes slower as the "IR" voltage drop decreases. Therefore, alternate embodiments may have different "IR" values, depending on different design requirements.

Transistor 340 is diode connected in order to provide a voltage drop of $V_{BE}$ between PRELIMINARY ADDRESS_SUM 311 and ADDRESS_SUM 312. Transistor 340 could also be replaced with other devices such as a diode to provide the necessary voltage drop. Transistors 343 and 344 act as current sources by also using the NBIAS signal 303 selectively coupled to each of their gates respectively. Transistor 344 is sized for a relatively low current, thus providing a weak pull-down on ADDRESS_SUM 312. Transistor 344 provides this current constantly throughout the circuit's operation. Transistor 343 is sized to provide a relatively strong current. In an alternate embodiment, transistor 343 is switched or becomes conductive in response to a control signal (e.g. OE_PORT1, where PORT1 is the port that has been given priority for the multi-port memory). If OE_PORT1 is active, then a read is occurring to memory 20, and if OE_PORT1 is not active then a write may be occurring. Transistor 343 is not conductive when OE_PORT1 is active. Therefore, dual port memory 20 may realize a current reduction when OE_PORT1 is active.

In this embodiment of the present invention, OE_PORT1 corresponds to the port chosen as the priority port for this design. Alternate embodiments of the present invention could choose a different port as the priority port. For example, if PORT 2 were chosen as the priority port, signal OE_PORT1 would be replaced with OE_PORT2. The priority port refers to the port that writes the data when both ports are writing to the same address location simultaneously. Further, if this is expanded to more than two ports, such as a three or four port memory, the OE_PORT 1 signal would be replaced with whichever output enable signal corresponds to the priority port.

Figure 10:
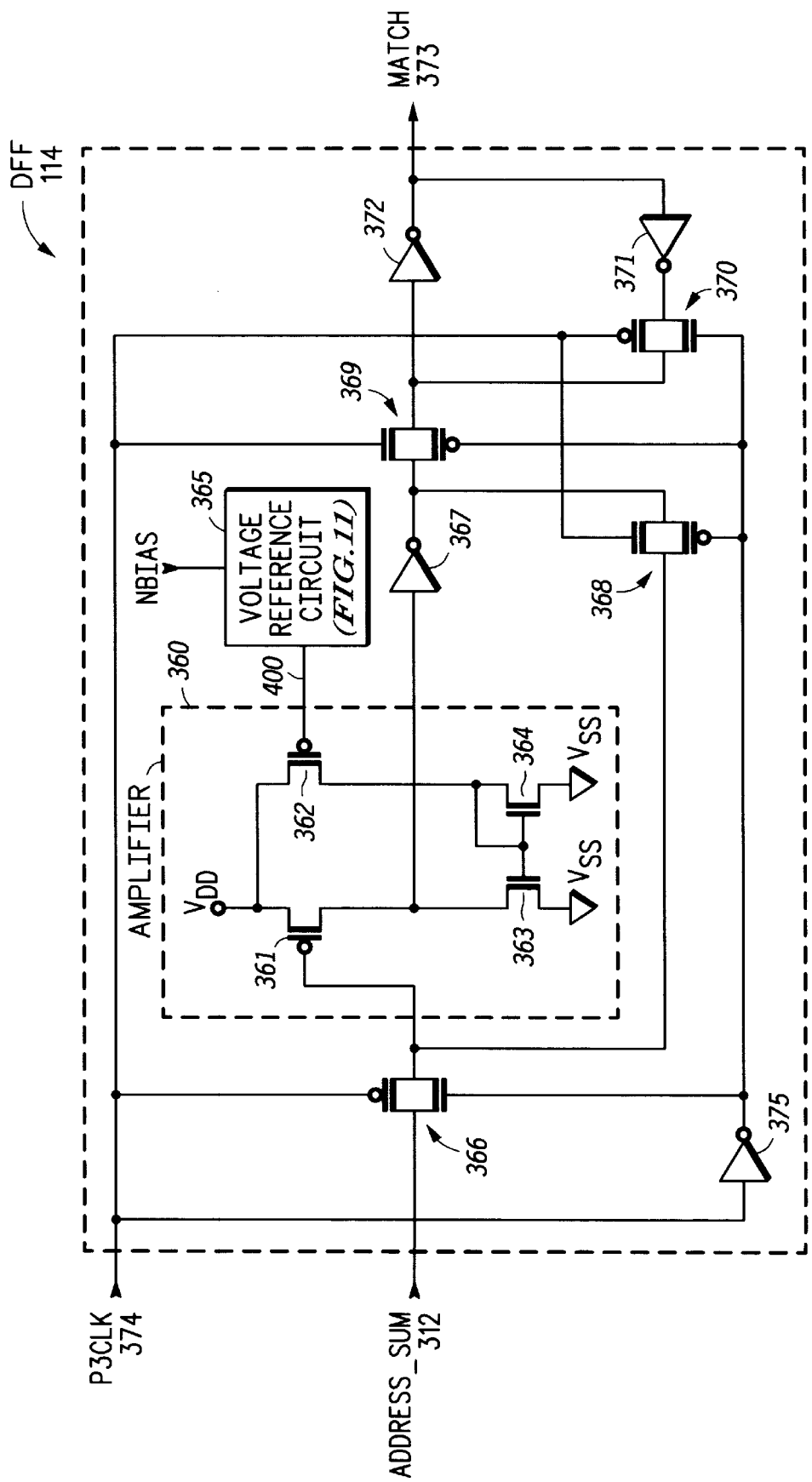
FIG. 10 illustrates in schematic diagram form one embodiment of D flip-flop 114 of FIG. 3.

FIG. 10 is a schematic of DFF 114 of FIG. 3. P3CLK 374 is an input to inverter 375, the inverted control terminal of pass gate 366, the true control terminal of pass gate 369, the inverted control terminal of pass gate 370, and the true control terminal of pass gate 368. ADDRESS_SUM 312 is an input to the first data terminal of pass gate 366. The second data terminal of pass gate 366 is connected to the gate of P-channel MOSFET transistor 361 and to the first data terminal of pass gate 368. The true control terminal of pass gate 366 is connected to the output of inverter 375, to the inverted control terminals of pass gate 368 and pass gate 369, and to the true control terminal of pass gate 370. The first current electrode of transistor 361 is connected to VDD and to the first current electrode of P-channel MOSFET transistor 362. The second current electrode of transistor 361 is connected to the input of inverter 367 and to the first current electrode of N-channel MOSFET transistor 363. The gate of transistor 363 is connected to the gate of N-channel MOSFET transistor 364 and to the first current electrode of transistor 364. The second current electrode of transistor 363 and the second current electrode of transistor 364 are connected to VSS. The first current electrode of transistor 364 is also connected to the second current electrode of transistor 362. NBIAS 303 is an input to voltage reference circuit 365. The output of voltage reference circuit 365, MATCH_REFERENCE 400, is connected to the gate of transistor 362. The output of inverter 367 is connected to the first data terminal of pass gate 369 and to the second data terminal of pass gate 368. The second data terminal of pass gate 369 is connected to the input of inverter 372 and to the first data terminal of pass gate 370. The output of inverter 372 is connected to the MATCH 373 and to the input of inverter 371. The output of inverter 371 is then connected to the second data terminal of pass gate 370. Differential amplifier 360 includes transistors 361, 362, 363, and 364. DFF 114 includes differential amplifier 360, voltage reference circuit 365, pass gates 366, 368, 369, and 370, and inverters 375, 367, 371, and 372.

Figure 11:
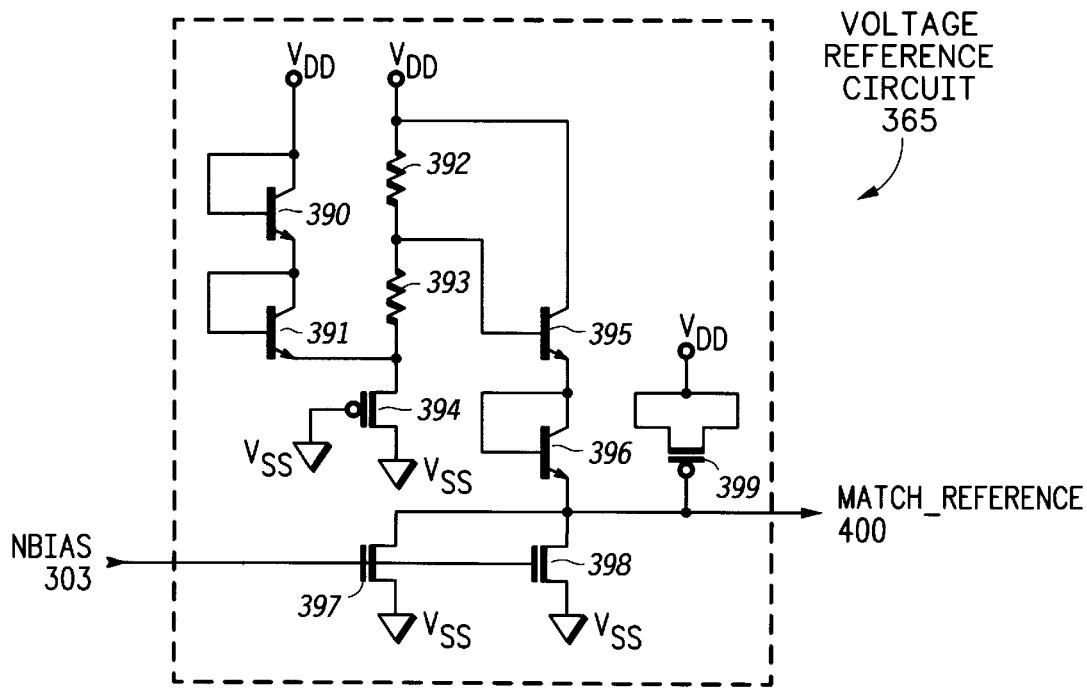
FIG. 11 illustrates in schematic diagram form one embodiment of voltage reference circuit 365 of FIG. 10.

In operation, DFF 114 receives the analog signal ADDRESS_SUM 312 and stores it as a nearly CMOS level in a register, which is then used to provide the output MATCH signal 373. When P3CLK 374 is low, ADDRESS_SUM 312 is coupled to the first input of differential amplifier 360 (specifically, to the gate of transistor 361), through pass gate 366. At this time, the signal at the gate of transistor 361 is an analog signal. Voltage reference circuit 365, which will be further described in reference to FIG. 11, provides a MATCH_REFERENCE signal 400 which is used by the differential amplifier 360 to compare ADDRESS_SUM 312 to the second input of differential amplifier 360. The differential amplifier 360 then compares the MATCH_REFERENCE signal 400 to the incoming analog signal coupled to the gate of transistor 361. If ADDRESS_SUM 312 is at a lower voltage than MATCH_REFERENCE signal 400, the input to inverter 367, found at the output of the differential amplifier 360, will be a logic level high. Likewise, if ADDRESS_SUM 312 is at a greater voltage than MATCH_REFERENCE 400, the input to inverter 367 will be a logic level low. At this point, the signal at the output of inverter 367 is at a logic level high.

The MATCH_REFERENCE signal 400 is connected to the gate of transistor 362, the second input of differential amplifier 360, and provides a signal halfway between the maximum and minimum voltages of ADDRESS_SUM 312. Therefore, as the maximum and minimum voltages of ADDRESS_SUM 312 vary in response to such factors as temperature, process, and environment while the circuit is operating, the MATCH_REFERENCE signal 400 will always remain halfway between the two values. In one embodiment of the present invention, the MATCH_REFERENCE signal 400 is halfway between the maximum and minimum voltage values of ADDRESS_SUM 312 so as to give both high and low logic states equal preference. In alternate embodiments, the MATCH_REFERENCE value 400 may be anywhere between the maximum and minimum voltage values of ADDRESS_SUM 312. Also, in alternate embodiments, the first input to the amplifier 360 at the gate of transistor 361 can be a differential input if it is not a wire-ORed output (as ADDRESS_SUM 312 is in one embodiment of the present invention described above).

When P3CLK 374 goes high, the nearly CMOS or BIC-MOS level signal at the output of inverter 367 is coupled to the first input of differential amplifier 360 (the gate of transistor 361), thus electrically isolating ADDRESS_SUM 312 and latching the amplifier logic state. While P3CLK 374 is high, the output from inverter 367 is coupled to the input of inverter 372 by way of pass gate 369, which then drives both the input of inverter 371 and the MATCH signal 373. When P3CLK 374 goes low, the output of inverter 371 is coupled to the input of 372, thus completing the latch and registering or storing the nearly CMOS or BICMOS level signal, MATCH 373, in DFF 114. In alternate embodiments, a current source can also be added between VDD and the first current electrodes of transistor 361 and transistor 362. This will likely lead to better amplifier characteristics due to the constant current provided by the current source.

FIG. 11 illustrates a schematic diagram of voltage reference circuit 365 of FIG. 10. The base of NPN bipolar transistor 390 is connected to the collector of transistor 390 and to VDD, and the emitter of transistor 390 is connected to the collector of NPN bipolar transistor 391 and to the base of bipolar transistor 391. The emitter of transistor 391 is connected to the first terminal of resistor 393 and to the first current electrode of P-channel MOSFET transistor 394. The gate of transistor 394 and the second current electrode of transistor 394 are both connected to VSS. The second terminal of resistor 393 is connected to the first terminal of resistor 392 and to the base of NPN bipolar transistor 395. The second terminal of resistor 392 is connected to both VDD and to the collector of bipolar transistor 395. The emitter of transistor 395 is connected to both the base and collector of NPN bipolar transistor 396. The emitter of transistor 396 is connected to the first current electrode of N-channel MOSFET transistor 397 and to the first current electrode of N-channel MOSFET transistor 398. NBIAS 303 is connected to the gate of transistor 397 and to the gate of transistor 398. Both the second current electrode of transistor 397 and the second current electrode of transistor 398 are connected to VSS. The gate of P-channel MOSFET transistor 399 is connected to the emitter of transistor 396 and to the output MATCH_REFERENCE 400. The first current electrode and second current electrode of transistor 399 are both connected to VDD.

In operation, voltage reference circuit 365 outputs the MATCH_REFERENCE signal 400 which tracks the midpoint value between the maximum and minimum values of analog signal ADDRESS_SUM 312 as described above. Transistor 394 is therefore purposely sized to be electrically equivalent to transistor 309 of FIG. 8 in order to provide similar currents to resistors 393 and 392 as transistor 309 provides to resistor 308 when operating at normal voltages and the input to transistor 309 is low, as described above. The resistance of resistors 392 and 393 are approximately half the resistance of resistor 308, and the base of transistor 395 is connected between resistors 392 and 393.

Transistor 396 is similar to transistor 340 of pull-down circuit 302 to provide the same voltage drop to MATCH_REFERENCE 400 as transistor 340 provides to ADDRESS_SUM 312. Transistors 397 and 398 are current sources used to provide a bias for transistors 395 and 396, and in alternate embodiments, a single current source may be used. Transistor 399 is used as a capacitor in order to filter out high frequency transients. During high voltage VDD operations, bipolar transistors 390 and 391 operate to clamp the base of bipolar transistor 395 to a known voltage. In alternate embodiments, they may not be used. Due to the similarities in transistor characteristics between elements of voltage reference circuit 365 and elements of level shifter 300 and pull down circuit 302 and due to the fact that resistors 392 and 393 each have approximately half the resistance of resistor 308 (with the gate of transistor 395 connected between the two resistors), the MATCH_REFERENCE signal 400 is able to track the midpoint value of ADDRESS_SUM 312.

Some embodiments may design the voltage reference circuit 365 as a modification of level shifter 300 by splitting resistor 308 into two equal valued resistors and then moving the base of bipolar transistor 310 between these two half value resistors. An advantage of this alternate embodiment is that this voltage reference circuit would also be able to track at high VDDs. This is due to the fact that a circuit such as level shifter 300 would include transistors that serve the same function as transistors 304, 305, and 307 which are used to determine the current through the split version of resistor 308 at high VDDs. The voltage reference circuit 365 disclosed above does not include the similar use of transistor 307 and would therefore not track the ADDRESS_SUM signal 312 at high VDDs where high VDDs are those outside the specified maximum operating value.

In one embodiment, the address collision detector 110 (see FIG. 3) is used for a dual port SRAM, but in alternate embodiments, it could be used for redundancy detection in a memory. Since the address collision detector circuit 110 is basically a comparison circuit, it can be used to compare the address being accessed to the address of a bad memory location, such as a row or column, for example, and determine if the two addresses match. If so, the bad memory location can be properly substituted before the memory access occurs. Furthermore, this address collision detector circuit 110 can be used as a comparison circuit in any circuit or design where a match between two signals or multi-bit values needs to be detected.

Although the present invention has been described with reference to a specific embodiment, further modifications and improvements will occur to those skilled in the art. For example, a dual-port memory according to the present invention may be constructed using different single port arrays of different densities. The timing signals used will also vary. Also, those of ordinary skill in the art can appreciate that variations in circuit design and elements may still accomplish the functions of the present invention. Therefore it is to be understood that the invention encompasses all such modifications that do not depart from the scope of the invention as defined in the appended claims.

What is claimed is:

1. A comparison circuit for comparing a first signal and a second signal to provide a comparison result signal, the comparison circuit comprising:

a level shifting circuit for receiving the first signal and the second signal, said level shifting circuit having an output;

a voltage reference circuit for providing a reference voltage;

a flip-flop circuit coupled to the output of said level shifting circuit, said flip-flop circuit comprising:
        a differential amplifier having an output, said differential amplifier being coupled to the voltage reference circuit for receiving the reference voltage; and
        a latching circuit comprising at least one field effect transistor, said latching circuit being coupled to the output of said differential amplifier, said latching circuit providing the comparison result signal as an output.

2. A comparison circuit as in claim 1, further comprising:
    a pull down circuit, coupled to said level shifting circuit.

3. A comparison circuit as in claim 1, further comprising:
    a regulated voltage circuit for providing a regulated voltage to said level shifter and to said voltage reference circuit.

4. A comparison circuit as in claim 1, wherein the first signal is a first address signal and the second signal is a second address signal.

5. A comparison circuit as in claim 1, wherein the comparison circuit is used in a multi-port memory.

6. A comparison circuit as in claim 5, wherein the comparison result signal is used to detect when more than one port of the multi-port memory is accessing a same address during a same memory access cycle.

7. A comparison circuit as in claim 1, wherein the comparison circuit is used for redundancy detection in a memory.

8. A comparison circuit as in claim 1, further comprising:
    a second level shifting circuit for receiving a third signal and a fourth signal, said second level shifting circuit having an output which is coupled to the output of the level shifting circuit.

9. A comparison circuit as in claim 8, wherein the output of the level shifting circuit and the output of the second level shifting circuit are wire-ORed.

10. A comparison circuit as in claim 1, wherein said flip-flop circuit further comprises:
    an inverter, coupled to said differential amplifier;
    wherein said differential amplifier in conjunction with said inverter perform a latching function having an output voltage swing magnitude that is at least twice as large as a corresponding input voltage swing magnitude.

11. An integrated circuit having a flip-flop circuit (114), said flip-flop circuit having an output, said flip-flop circuit comprising:

a differential amplifier having an input for receiving a reference voltage and having an output; and a latching circuit comprising at least one field effect transistor, said latching circuit coupled to the output of said differential amplifier, said latching circuit providing the output of the flip-flop circuit, wherein said integrated circuit further comprises a voltage reference circuit for providing the reference voltage to said differential amplifier and wherein said latching circuit is coupled to provide feedback to said differential amplifier.

12. A flip-flop circuit as in claim 11, wherein said differential amplifier further comprises:

a first transistor having a first current electrode coupled to a first power supply level, having a second current electrode, and having a gate electrode;

a second transistor having a first current electrode coupled to the second current electrode of the first transistor, having a second current electrode coupled to a second power supply level, and having a gate electrode;

a third transistor having a first current electrode coupled to the first power supply level, having a second current electrode, and having a gate electrode coupled to a voltage reference; and a fourth transistor having a first current electrode coupled to the second current electrode of the third transistor, having a second current electrode coupled to the second power supply level, and having a gate electrode coupled to the first current electrode of the fourth transistor and coupled to the gate electrode of the second transistor;

wherein said flip-flop circuit further comprises:

a first transmission gate, having a first terminal for receiving a flip-flop input signal, having a second terminal coupled to the gate electrode of the first transistor, and having a control terminal for receiving a clock signal;

a second transmission gate, having a first terminal coupled to the second terminal of the first transmission gate, having a second terminal, and having a control terminal for receiving the clock signal;

an inverter, having a first terminal coupled to the second current electrode of the first transistor, and having a second terminal coupled to the second terminal of the second transmission gate;

a third transmission gate, having a first terminal coupled to the second terminal of the inverter, having a second terminal coupled to the latching circuit, and having a control terminal for receiving the clock signal; and a fourth transmission gate, having a first terminal coupled to the second terminal of the third transmission gate, having a second terminal coupled to the latching circuit, and having a control terminal for receiving the clock signal.

\* \* \* \* \*